(12) United States Patent
Yang et al.

(10) Patent No.: US 11,898,842 B1
(45) Date of Patent: Feb. 13, 2024

(54) METHOD AND SYSTEM FOR CALCULATING TURBULENT MIXING INTENSITY, COMPUTER DEVICE AND STORAGE MEDIUM

(71) Applicant: Ocean University of China, Shandong (CN)

(72) Inventors: Hua Yang, Qingdao (CN); Beibei Mao, Qingdao (CN); Xiaoyu Zhu, Qingdao (CN); Yuxuan Zheng, Qingdao (CN); Wenbo Li, Qingdao (CN); Han Zhang, Qingdao (CN)

(73) Assignee: OCEAN UNIVERSITY OF CHINA, Shandong (CN)

( * ) Notice: Subject to any disclaimer, the term of this patent is extended or adjusted under 35 U.S.C. 154(b) by 0 days.

(21) Appl. No.: 18/487,231

(22) Filed: Oct. 16, 2023

(30) Foreign Application Priority Data

Jan. 3, 2023 (CN) .......................... 202310000629.5

(51) Int. Cl.
G01C 13/00 (2006.01)
(52) U.S. Cl.
CPC ................................ G01C 13/002 (2013.01)
(58) Field of Classification Search
CPC ...... Y02A 90/30; Y02A 10/40; Y02A 20/144; G01C 13/002; G01C 13/00
See application file for complete search history.

(56) References Cited

PUBLICATIONS

Xin Luan, Beibei Mao, Xinmin Ren, Hua Yang, Yuru Teng "Turbulent Cascade in the Multi-layered Network" College of Information Science and Engineering, Ocean University of China, Qingdao, China Feb. 10, 2023 (5 pages).

*Primary Examiner* — Tarun Sinha
(74) *Attorney, Agent, or Firm* — Volpe Koenig

(57) ABSTRACT

It is provided a method and system for calculating a turbulent mixing intensity, a computer device and a storage medium. The method comprises: performing denoising preprocess on ocean spatiotemporal coupled shear profile data information obtained by a turbulence profiler; constructing a multi-layer turbulent mixing network with topological attributes, where the network includes nodes and connecting edges; and each node is formed by fusion of four physical properties: time series, scale data, energy local intermittency measure and phase; recognizing a cross-scale transfer process of the turbulent energy according to a presence state of the connecting edges in the network; and performing parametric calculation of the turbulent mixing intensity according to the topological attributes of the multi-layer turbulent mixing network. According to the method, quantitative calculation of a turbulent energy transport intensity in an observation area of a full ocean depth profile is implemented.

7 Claims, 2 Drawing Sheets

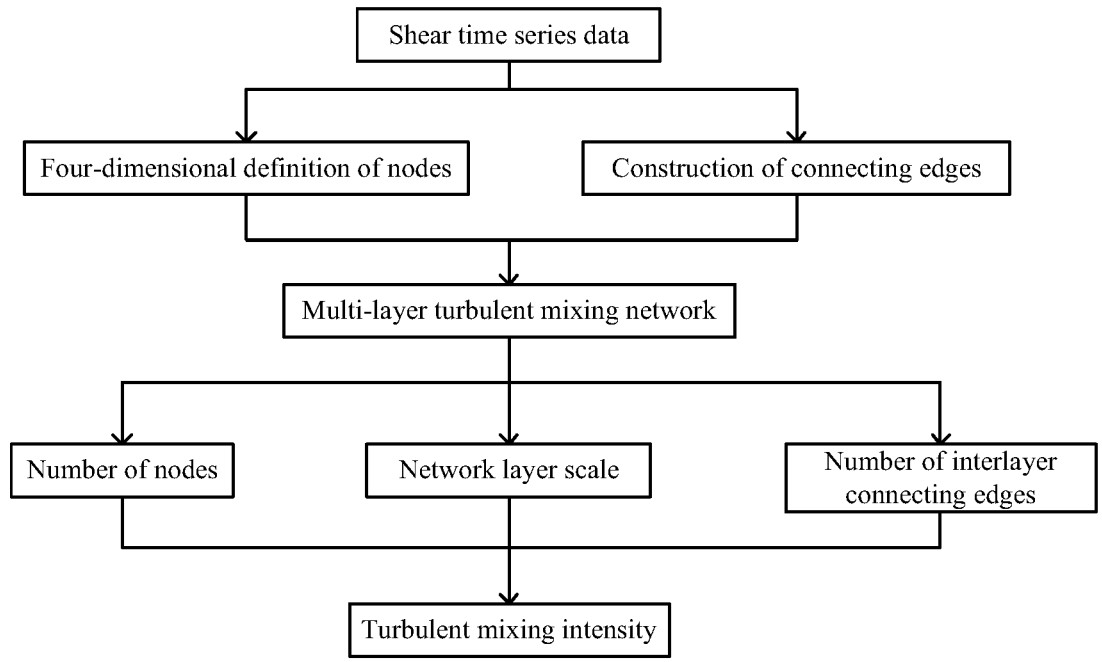
FIG. 1
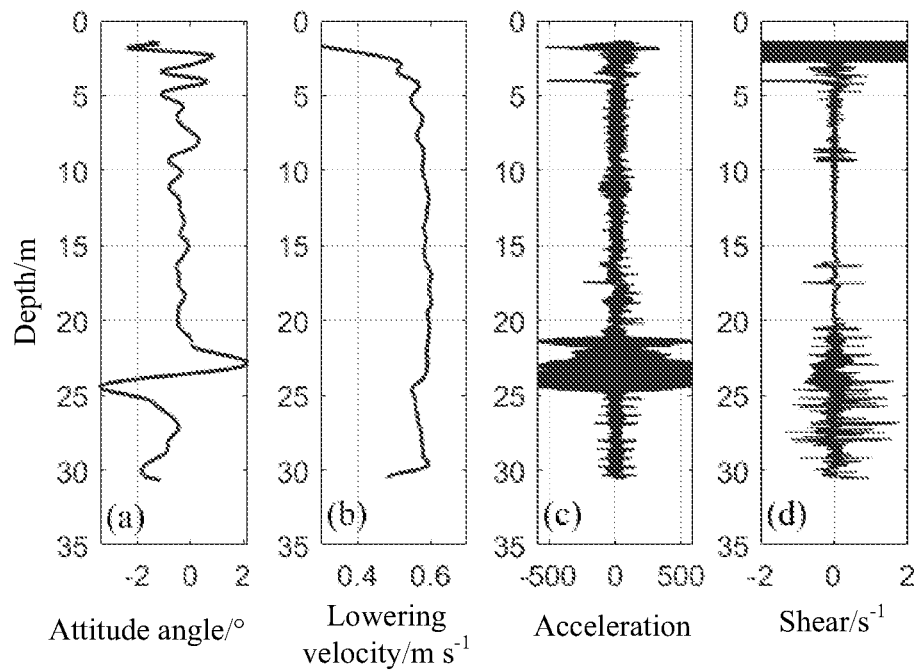
| FIG. 2A | FIG. 2B | FIG. 2C | FIG. 2D |

METHOD AND SYSTEM FOR CALCULATING TURBULENT MIXING INTENSITY, COMPUTER DEVICE AND STORAGE MEDIUM

CROSS REFERENCE TO RELATED APPLICATION

This patent application claims the benefit and priority of Chinese Patent Application No. 202310000629.5 filed with the China National Intellectual Property Administration on Jan. 3, 2023, the disclosure of which is incorporated by reference herein in its entirety as part of the present application.

TECHNICAL FIELD

The present disclosure relates to the technical field of ocean turbulence data analysis, and in particular, to a method and system for calculating a turbulent mixing intensity, a computer device and a storage medium.

BACKGROUND

Turbulent mixing is one of the important physical processes in the ocean. The turbulent mixing process is accompanied by an energy cascade process in which large-scale vortices are continuously cracked into meso-scale and micro-scale vortices. Multi-scale vortex interaction plays a vital role in improving transport of ocean energy, momentum and matter and maintaining ocean circulation. With the continuous innovation of ocean observation instruments and continuous expansion of the ocean exploration field, using reliable and effective algorithms to detect and quantify the turbulent multi-scale energy mixing process has become a key link to improving the study of a physical ocean mechanism and the prediction of ocean phenomena. Vortex structures with different scales are ideal carriers for cracking a coupling of marine water. With the continuous deepening of research on turbulent mixing, researchers have gradually realized that ocean energy mainly relies on interactive mixing of vortex structures at different scales. However, turbulent data features nonlinearity and unstability, and the flow velocity and direction at any point in the marine water exhibit strongly transient, which greatly limits the research process of a turbulent mixing mechanism.

Currently, the research on turbulent mixing phenomena mainly focuses on spectral flux estimation and numerical simulation. Methods of spectral flux estimation usually need specific prior knowledge or specific adjustment of physical formulas to maintain the balance of a turbulent system. Although the numerical simulation methods can reflect the process of multi-scale fluid interactive energy transfer, the computing power of a computer required by the methods increases sharply with the increase of a scenario size, and each simulation method has limitations in application scenarios. Thanks to rapid development of ocean exploration instruments, a large number of ocean data urgently needs a more efficient algorithm to realize quantitative study of a turbulent multi-scale energy mixing mechanism, which has important application value for realizing real-time processing of turbulence data observed during lowering of the instrument, rapid capture of ocean phenomena in a full ocean depth profile and depth tracking of an ocean mechanism.

SUMMARY

The present disclosure provides a method for calculating a turbulent mixing intensity, to implement quantitative calculation of a turbulent energy transport intensity in an observation area of a full ocean depth profile by means of a method for network construction by fusion of a plurality of physical features, and relying on topological structure attributes.

To achieve the above objective, the present disclosure adopts a technical solution as follows:

A method for calculating a turbulent mixing intensity includes the following steps:
  step 1: performing denoising preprocess on ocean spatiotemporal coupled shear profile data information obtained by a turbulence profiler;
  step 2: constructing a multi-layer turbulent mixing network with topological attributes, where
  the multi-layer turbulent mixing network includes nodes and connecting edges; preferably, the multi-layer turbulent mixing network is consisted of nodes and connecting edges; and
  each node in the network may be formed by fusion of four physical properties: time series, scale data, energy local intermittency measure and phase, so as to realize topological representation of physical properties of multi-scale turbulent energy; and
  recognizing a cross-scale transfer process of the turbulent energy according to a presence state of the connecting edges in the network; and
  step 3: performing parametric calculation of the turbulent mixing intensity according to the topological attributes of the multi-layer turbulent mixing network.

In addition, based on the above method for calculating a turbulent mixing intensity, the present disclosure further provides a system for calculating a turbulent mixing intensity corresponding thereto, which uses the following technical solution:

A system for calculating a turbulent mixing intensity includes:
  a preprocessing module, configured to perform denoising preprocess on ocean spatiotemporal coupled shear profile data information obtained by a turbulence profiler;
  a network construction module, configured to construct a multi-layer turbulent mixing network with topological attributes, where
  the multi-layer turbulent mixing network includes nodes and connecting edges; preferably, the multi-layer turbulent mixing network is consisted of nodes and connecting edges; and
  each node in the network may be formed by fusion of four physical properties: time series, scale data, energy local intermittency measure and phase, so as to realize topological representation of physical properties of multi-scale turbulent energy; and
  recognize a cross-scale transfer process of the turbulent energy according to a presence state of the connecting edges in the network; and
  a turbulent mixing intensity calculation module, configured to calculate the turbulent mixing intensity according to the topological attributes of the multi-layer turbulent mixing network, to obtain a turbulent mixing intensity value by calculation.

In addition, based on the above method for calculating a turbulent mixing intensity, the present disclosure further provides a computer device for implementing the above method for calculating a turbulent mixing intensity.

The computer device includes a memory and a processor, where executable code may be stored in the memory, and when the processor executes the executable code, the steps of the method for calculating a turbulent mixing intensity described above are implemented.

In addition, based on the above method for calculating a turbulent mixing intensity, the present disclosure further provides a computer-readable storage medium for implementing the above method for calculating a turbulent mixing intensity.

A program may be stored on the computer-readable storage medium. When the program may be executed by a processor, the steps of the method for calculating a turbulent mixing intensity described above are implemented.

The present disclosure has the following advantages:

As described above, the present disclosure relates to a method and system for calculating a turbulent mixing intensity, a computer device, and a storage medium. A dynamic principle implied in the turbulent multi-scale energy interaction process can be well acquired by using a multi-layer turbulent mixing network principle adopted in the present disclosure, details of multi-scale energy transfer are effectively captured and showed by using the nodes and the connecting edges in the multi-layer turbulent mixing network, the process of calculating turbulent mixing intensity parameters is completed according to topological attributes, so that the calculation efficiency of turbulent mixing parameterization is improved, the limitation on an exploration scope in the ocean field is broken through, and the efficient analysis and control of the turbulent energy interaction process in the full ocean depth profile area are realized, which is of great significance to the study of the physical mechanism of ocean cycle evolution.

BRIEF DESCRIPTION OF THE DRAWINGS

FIG. 1 is a flowchart of a method for calculating a turbulent mixing intensity according to an embodiment of the present disclosure;

FIGS. 2A-2D are diagrams of turbulent shear profile data information;

DETAILED DESCRIPTION OF THE EMBODIMENTS

The present disclosure is described in more detail below with reference to the accompanying drawings and specific implementations.

As shown in FIG. 1, this embodiment describes a method for calculating a turbulent mixing intensity, to implement quantitative calculation of a turbulent energy transport intensity in an observation area across a full ocean depth profile.

The method for calculating a turbulent mixing intensity includes the following steps 1 to 3.

In step 1, denoising preprocess is performed on ocean spatiotemporal coupled shear profile data information obtained by a turbulence profiler.

As shown in FIGS. 2A-2D, turbulent shear data features nonlinearity and unstability, and is easily disturbed by a marine external environment. Therefore, ocean data obtained by the ocean profiler needs to be preprocessed.

Accord to the present disclosure, original turbulence profile data is denoised by utilizing acquired lowering velocity, lowering gesture and lowering acceleration data during an instrument lowering process in combination with a Goodman algorithm.

Environmental noise and instrument vibration noise contained in the original shear signal are eliminated by the denoising, and a relatively pure shear signal that can represent information of turbulence itself is obtained, which provides data support for subsequent parametric calculation of the turbulent mixing intensity.

In step 2, a multi-layer turbulent mixing network with topological attributes is constructed, where the network includes nodes and connecting edges. Preferredly, the multi-layer turbulent mixing network is consisted of nodes and connecting edges.

Each node in the network is formed by fusion of four physical properties: time series, scale data, energy local intermittency measure and phase, so as to realize topological representation of physical properties of multi-scale turbulent energy.

Across-scale transfer process of the turbulent energy is recognized according to a presence state of the connecting edges in the network.

The topological attributes of the nodes and the connecting edges in the multi-layer turbulent mixing network constructed by the method according to the present disclosure provide a complete model basis for the analysis and mining of the multi-scale turbulent energy interaction process in subsequent steps.

In the network node definition stage of the multi-layer turbulent mixing network, the rough process is as follows:

Depth series shear profile data is first divided into 1-meter depth segments, and the multi-layer network is constructed in segments; then empirical mode decomposition, wavelet transform, local intermittency measure calculation and Hilbert transform are used to complete physical feature fusion of network nodes, that is, each node has four physical properties: the time series, the scale data, the energy local intermittency measure and the phase.

Figure 3:
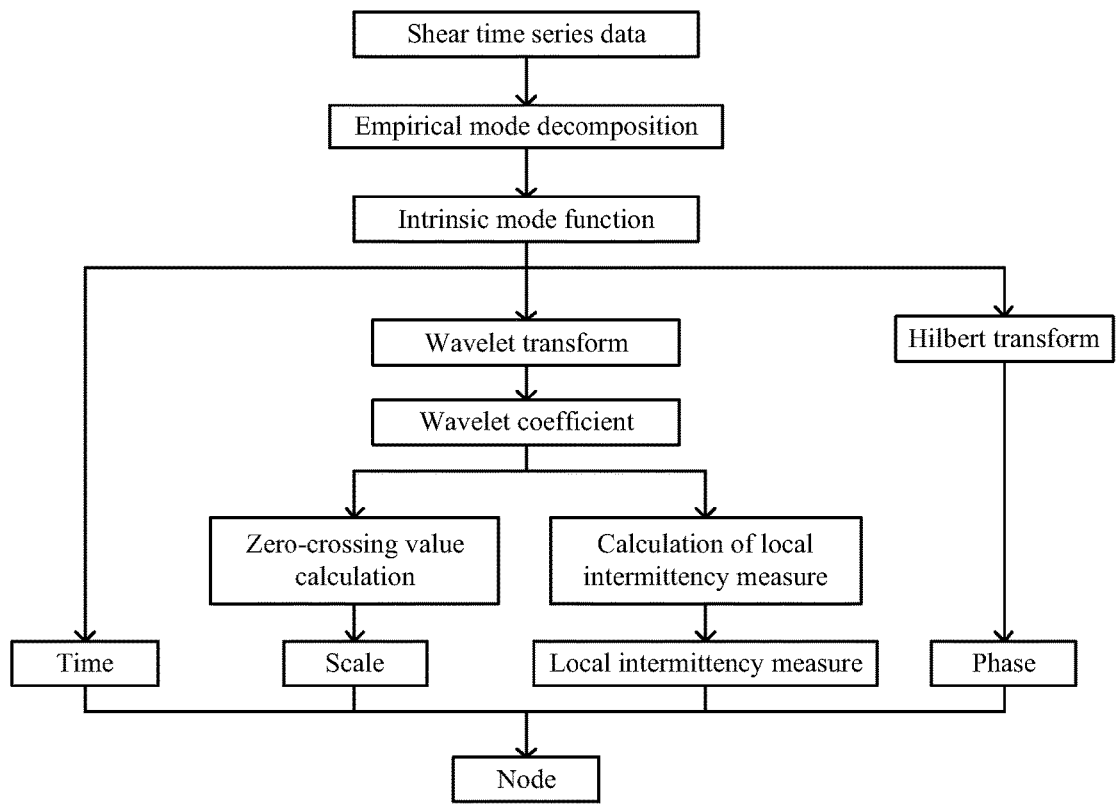
FIG. 3 is a flowchart of node definition of a multi-layer turbulent mixing network according to an embodiment of the present disclosure.

As shown in FIG. 3, in a node definition stage, the process of defining each node by fusing the physical properties, namely, the time series, the scale data, the energy local intermittency measure and the phase, based on multiple nonlinear process methods includes the following steps 2.1 to 2.4.

In step 2.1, a nonlinear and unstable shear data signal s(t) is decomposed into n intrinsic mode functions (IMFs) by empirical mode decomposition, with a decomposition formula as follows: $s(t)=\Sigma^{n}_{i=1}IMF_i(t)+r_n(t)$, where $IMF_i(t)$ represents an $i^{th}$ intrinsic mode function, $i \in [1, n]$, and $r_n(t)$ is a residual component, and where different intrinsic mode functions have different characteristic frequencies.

An empirical mode decomposition algorithm decomposes nonlinear turbulence data into intrinsic mode signals with different physical characteristics.

In step 2.2, wavelet coefficients $w_{a,b}$ corresponding to different intrinsic mode functions are calculated by using wavelet transform.

Energy distribution characteristics corresponding to respective intrinsic mode functions are quantify, and scale attributes corresponding to the different intrinsic mode functions are represented by using ratios of a time length corresponding to the shear data signal s(t) to zero-crossing values corresponding to the wavelet coefficients $w_{a,b}$.

In step 2.3, a fluctuation of the energy local intermittency measure (LIM) is calculated based on the calculated wavelet coefficients $w_{a,b}$, and energy intermittent burst is identified from turbulent data according to LIM data, with a calculation formula as follows:

$LIM=|w_{a,b}|^2/<|w_{a,b}|^2>b$, where LIM represents the energy local intermittency measure.

a represents scale information of the wavelet coefficients, b represents a time scale corresponding to the wavelet coefficients; $w_{a,b}$ represents the wavelet coefficients, $|w_{a,b}|$ represents modulus values of the wavelet coefficients, and <•>b represents averaging process of the wavelet coefficients within time scale ranges b.

The purpose of wavelet transform and local intermittency measure algorithm in the present disclosure is to quantify the energy fluctuation of the intrinsic mode functions.

In step 2.4, phase change attributes during different intrinsic mode fluctuations are calculated based on Hilbert transform, where Hilbert transform is used to detect the phase fluctuation during transfer of energy at different scales.

Hilbert transform in this embodiment provides algorithm support for the identification of the turbulent multi-scale energy interaction process.

So far, topological definition of nodes is completed, where nodes with different scale attributes are distributed in different network layer structures.

Figure 4:
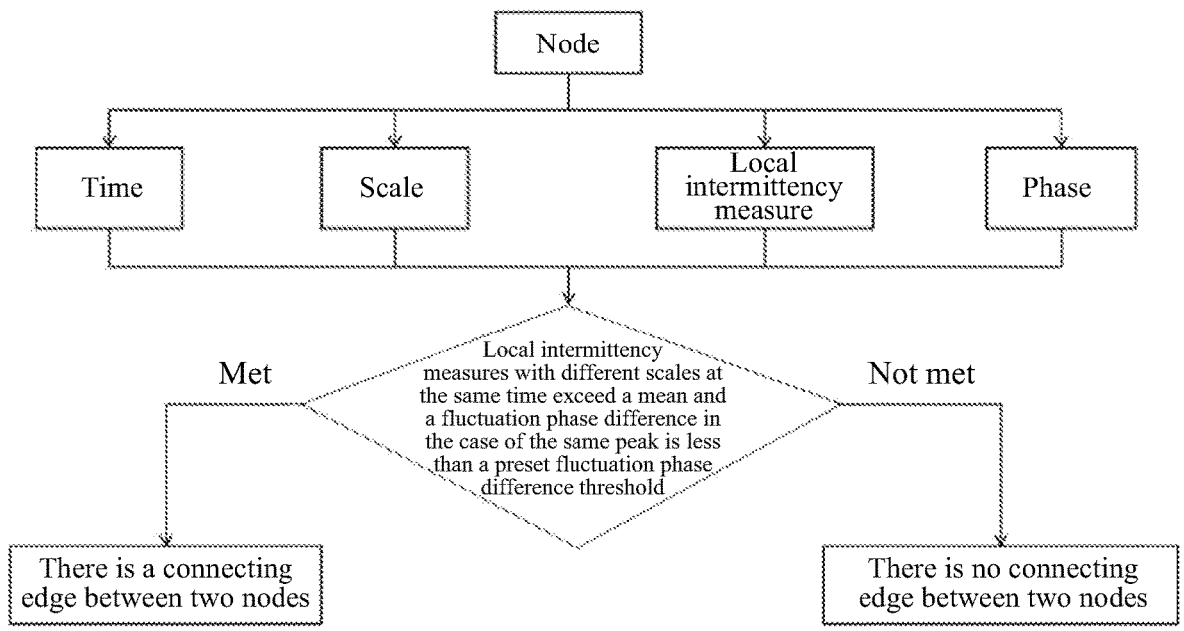
FIG. 4 is a flowchart of construction of a connecting edge of a multi-layer turbulent mixing network according to an embodiment of the present disclosure.

As shown in FIG. 4, the physical properties of nodes are used to construct the connecting edges, the energy local intermittency measure will exceed a series mean value during transfer of the energy at different scales, and a phase synchronization phenomenon in which phases synchronously increase or decrease appears.

When two nodes with different scale attributes at the same time have energy local intermittency fluctuations being in a peak and beyond a mean value, and a fluctuation phase difference is less than a predetermined fluctuation phase difference threshold, there exists a connecting edge between the two nodes, that is, the turbulent energy is transferred in a cross-scale manner between vortices of different scales represented by the two nodes; and a predetermined fluctuation phase difference threshold is, for example, 0.01.

When two nodes with different scale attributes at the same time have energy local intermittency measures that are not all in peak or some of which are below a mean value, or have a fluctuation phase difference greater than a predetermined fluctuation phase difference threshold, there does not exists connecting edge between the two nodes, that is, no turbulent energy is transferred in a cross-scale manner between vortices of different scales represented by the two nodes.

Through the definition of nodes and the construction of connecting edges in the above multi-layer turbulent mixing network, a multi-layer network structure that includes nodes and cross-layer connecting edges can be constructed, and the distribution of the nodes and the cross-layer connecting edges varies with different turbulent mixing states (namely, the topological attributes of the multi-layer turbulent mixing network), which provides topological network parameters for the calculation of the turbulent mixing intensity.

In the method according to the present disclosure, through definition of the nodes and the construction of the connecting edges, the topological transform of the physical ocean process can be implemented, the multi-layer turbulent mixing network is constructed. Based on the topological attributes of the network, a powerful mining and processing platform can be provided for the efficient processing of big data about an ocean area observation across the full ocean depth and for the analysis of a mechanism of physical ocean phenomena.

In step 3, the parametric calculation of the turbulent mixing intensity is performed according to the topological attributes of the multi-layer turbulent mixing network.

According to the above process of definition of the nodes and construction of the connecting edges, the transformation from the turbulent mixing process to the topological structure of multi-layer turbulent mixing network can be implemented, and the constructed multi-layer turbulent mixing network structure M may be represented by a triple, where M=<V,E,L>.

V represents a node set, E represents a connecting edge combination, and L represents a network layer set with the same scale characteristics.

Each node i is a multivariate parameter set, and nodes with the same scale attribute $S_\alpha$ are distributed on the same network layer $\alpha$; and during energy transfer, the cross-scale energy transfer process is mainly concerned.

Therefore, a constructed network architecture only includes a cross-scale interlayer connecting edge $e_{\alpha\beta}$, namely:

$e_{\alpha\beta}=\{((i,\alpha),(j,\beta))\in E|\alpha\neq\beta\}$; and the node i existing in the network layer $\alpha$ and a node j existing in the network layer $\beta$ are connected by the connecting edge $e_{\alpha\beta}$.

The distribution of cross-layer connecting edges provides a visual model for the study of the cross-scale transfer mechanism of turbulent energy and supports the overall estimation of the turbulent energy mixing intensity.

Different turbulent mixing phenomena are accompanied by the different distributions of network cross-layer connecting edges with different densities.

A network layer scale parameter S, a number of network connecting edges $e_{\alpha\beta}$ and a number N of cross-layer connecting edges (that is, all network nodes are connected one by one) that should appear in an ideal case, which are included in the multi-layer network structure, are counted.

The constructed multi-layer turbulent mixing network is analyzed, to obtain the topological attributes of the multi-layer turbulent mixing network, namely, a number of nodes in each layer in the network structure, network layer scale attributes and a number of interlayer connecting edges.

The number of nodes in each layer in the network structure refers to a number of sampling points contained in the shear data signal s(t), and the network layer scale attributes refer to ratios of the length of the time series corresponding to the shear data signal s(t) to zero-crossing values corresponding to the wavelet coefficients.

The number of interlayer connecting edges refers to the number of connecting edges constructed in two adjacent network layers upon meeting a connecting edge construction conditions.

A turbulent mixing intensity $\kappa$ is calculated depending on the topological attributes, as fallows.

$$\kappa = \frac{1}{\sum_{\alpha\beta\subset L}\left(\frac{1}{2^{s_\alpha}}+\frac{1}{2^{s_\beta}}\right)\frac{e_{\alpha\beta}}{N}},$$

where N represents a total number of nodes contained in each network layer in the multi-layer turbulent mixing network;

$\alpha$ and $\beta$ represent two adjacent network layers, $e_{\alpha\beta}$ represents a number of connecting edges between adjacent network layers $\alpha$ and $\beta$, and $S_\alpha$ and $S_\beta$ represent respective corresponding scale attributes of the two adjacent network layers α and β; and L represents a network layer set, and αβ ⊂ L represents that α and β are network layers in the network layer set L.

Depth series data is divided into equal depth segments for network construction and parametric calculation of the turbulent mixing intensity, which can meet analysis and research tasks according to different demands on coarse-grained and fine situations in the spatiotemporal evolution of turbulent mixing across full ocean depth.

Depending on the calculation method for quantifying the turbulent mixing process based on topological attributes according to the present disclosure, a parametric analysis basis is provided for the in-depth mining of the multi-scale energy interaction process observed in water body across the full ocean depth profile during the free lowering of the turbulence profiler, the capture of the cross-scale energy transfer process is implemented, so that scientific requirements for the observation and analysis of the full ocean depth turbulence profile are met.

The method for calculating a turbulent mixing intensity according to the present disclosure overcomes the limitations of the data processing capability and the detection area in the prior art, and provides method support for the in-depth analysis of the multi-scale interactive transfer process of turbulent energy.

In addition, based on the same inventive concept, an embodiment of the present disclosure further provides a system for calculating a turbulent mixing intensity corresponding to the above method for calculating a turbulent mixing intensity.

The system for calculating a turbulent mixing intensity includes the following functional modules:
- a preprocessing module, configured to perform denoising preprocess on ocean spatiotemporal coupled shear profile data information obtained by a turbulence profiler;
- a network construction module, configured to construct a multi-layer turbulent mixing network with topological attributes, where
- the multi-layer turbulent mixing network includes nodes and connecting edges; preferredly, the multi-layer turbulent mixing network is consisted of nodes and connecting edges; and
- each node in the network is formed by fusion of four physical properties: time series, scale data, energy local intermittency measure and phase, so as to realize topological representation of physical properties of multi-scale turbulent energy; and
- recognize a cross-scale transfer process of the turbulent energy according to a presence state of the connecting edges in the network; and
- a turbulent mixing intensity calculation module, configured to calculate the turbulent mixing intensity according to the topological attributes of the multi-layer turbulent mixing network, to obtain a turbulent mixing intensity value by calculation.

It should be noted that in the above system for calculating a turbulent mixing intensity, the realization process of the functions of each module is detailed in the realization process of the corresponding steps in the above method, and details are not described herein again.

In addition, the present disclosure further provides a computer device for implementing the above method for calculating a turbulent mixing intensity. The computer device includes a memory and one or more processors.

Executable code is stored in the memory, and when the processor executes the executable code, the steps of the above method for calculating a turbulent mixing intensity are implemented.

In this embodiment, the computer device is any device or apparatus with data processing capability, and details are not described herein again.

In addition, an embodiment of the present disclosure further provides a computer-readable storage medium in which a program is stored, where when the program is executed by a processor, the steps of the above method for calculating a turbulent mixing intensity are implemented.

The computer-readable storage medium may be an internal storage unit of any device or apparatus with data processing capability, such as a hard disk or a memory, or an external storage device of any device with data processing capability, such as a plug-in hard disk, a smart media card (SMC), a secure digital (SD) card and a flash card provided on a device.

Of course, the above-mentioned descriptions are merely preferred embodiments of the present disclosure, and the present disclosure is not limited to the above-described embodiments. It should be noted that all equivalent substitutions or obvious transformation forms made by any person skilled in the art under the teachings of the present specification should fall within the substantive scope of the present specification and be protected by the present disclosure.

What is claimed is:

1. A method for calculating a turbulent mixing intensity, comprising following steps:
   step 1: performing denoising preprocess on ocean spatiotemporal coupled shear profile data information obtained by a turbulence profiler;
   step 2: constructing a multi-layer turbulent mixing network with topological attributes, wherein
   the multi-layer turbulent mixing network comprises nodes and connecting edges; and
   each node in the multi-layer turbulent mixing network is formed by fusion of four physical properties that comprise time series, scale data, energy local intermittency measure and phase, so as to realize topological representation of physical properties of multi-scale turbulent energy; and
   recognizing a cross-scale transfer process of the turbulent energy according to a presence state of the connecting edges in the network;
   wherein in the step 2, in a node definition stage, each node is defined by fusing the physical properties: the time series, the scale data, the energy local intermittency measure and the phase, based on multiple nonlinear processing methods, which comprises following substeps:
   step 2.1: decomposing a nonlinear and unstable shear data signal s(t) into n intrinsic mode functions (IMFs) by empirical mode decomposition, with a decomposition formula as follows:

$s(t)=\Sigma^{n}_{i=1}\text{IMF}_i(t)+r_n(t),$ wherein $\text{IMF}_i(t)$ represents an $i^{th}$ intrinsic mode function, i∈[1, n], and $r_n(t)$ is a residual component;
   step 2.2: calculating wavelet coefficients $w_{a,b}$ corresponding to different intrinsic mode functions by using wavelet transform;
   quantifying energy distribution characteristics corresponding to the respective intrinsic mode functions, and representing scale attributes corresponding to the different intrinsic mode functions with ratios of a length of the time series corresponding to the shear data signal s(t) to zero-crossing values corresponding to the wavelet coefficients $w_{a,b}$;

step 2.3: calculating a fluctuation of the energy local intermittency measure LIM based on the wavelet coefficients $w_{a,b}$ calculated in step 2.2, and identifying energy intermittent burst from the turbulent data according to LIM data, with a calculation formula as follows:

$$LIM = |w_{a,b}|^2 / <|w_{a,b}|^2 >_b,$$

wherein LIM represents the energy local intermittency measure;

a represents scale information of the wavelet coefficients, b represents time scales corresponding to the wavelet coefficients; $w_{a,b}$ represents the wavelet coefficients, $|w_{a,b}|$ represents modulus values of the wavelet coefficients, and $<\cdot>_b$ represents averaging process of the wavelet coefficients within time scale ranges b; and step 2.4: calculating phase change attributes during different intrinsic mode fluctuations, thereby completing topological definition of the nodes, wherein the nodes with different scale attributes are distributed in different network layer structures;

wherein in the step 2, construction of the connecting edges is completed based on the physical properties contained in the nodes, which is as follows:

when two nodes with different scale attributes at a same time have energy local intermittency fluctuations being in a peak and beyond a mean value, and a fluctuation phase difference is less than a predetermined fluctuation phase difference threshold, there exists a connecting edge between the two nodes, that is, there exists the cross-scale transfer process of the turbulent energy between vortices of different scales represented by the two nodes; and when two nodes with different scale attributes at a same time have energy local intermittency measures that are not all in the peak or some of which are below the mean value, or a fluctuation phase difference is greater than a predetermined fluctuation phase difference threshold, there does not exist the connecting edge between the two nodes, that is, there does not exist the cross-scale transfer process of the turbulent energy between the vortices of different scales represented by the two nodes, and step 3: performing parametric calculation of the turbulent mixing intensity according to the topological attributes of the multi-layer turbulent mixing network;

wherein the step 3 comprises:

analyzing the constructed multi-layer turbulent mixing network, and obtaining the topological attributes of the multi-layer turbulent mixing network that comprise a number of nodes in each layer in the network structure, network layer scale attributes and a number of interlayer connecting edges, wherein the number of nodes in each layer in the network structure refers to a number of sampling points contained in the shear data signal s(t), and the network layer scale attributes refer to the ratios of the length of the time series corresponding to the shear data signal s(t) to zero-crossing values corresponding to the wavelet coefficients; and the number of interlayer connecting edges refers to the number of connecting edges constructed between two adjacent network layers upon meeting connecting edge construction conditions; and calculating a turbulent mixing intensity κ depending on the topological attributes, with a formula as follows:

$$\kappa = \frac{1}{\sum_{\alpha\beta \subset L}\left(\frac{1}{2^{s_\alpha}} + \frac{1}{2^{s_\beta}}\right)\frac{e_{\alpha\beta}}{N}},$$

wherein N represents a total number of nodes contained in each network layer in the multi-layer turbulent mixing network;

α and β represent two adjacent network layers, $e_{\alpha\beta}$ represents a number of connecting edges between adjacent network layers α and β, and $S_\alpha$ and $S_\beta$ represent respective scale attributes of the two adjacent network layers α and β; and L represents a network layer set, and $\alpha\beta \subset L$ represents that α and β are network layers in the network layer set L.

2. The method for calculating a turbulent mixing intensity according to claim 1, wherein the step 1 comprises:

performing the denoising preprocess on turbulent profile data by using a Goodman algorithm with reference to velocity data, gesture data and acceleration data of the turbulence profiler, collected during lowering of the turbulence profiler; and eliminating environmental noise and vibration noise contained in original shear data by the denoising preprocess, and retaining real shear data information.

3. A system for calculating a turbulent mixing intensity, comprising:

a preprocessing module, configured to perform denoising preprocess on ocean spatiotemporal coupled shear profile data information obtained by a turbulence profiler;

a network construction module, configured to construct a multi-layer turbulent mixing network with topological attributes, wherein the multi-layer turbulent mixing network comprises nodes and connecting edges; and each node in the network is formed by fusion of four physical properties: time series, scale data, energy local intermittency measure and phase, so as to realize topological representation of physical properties of multi-scale turbulent energy; and recognize a cross-scale transfer process of the turbulent energy according to a presence state of the connecting edges in the network;

wherein in a node definition stage, each node is defined by fusing the physical properties that comprise the time series, the scale data, the energy local intermittency measure and the phase, based on multiple nonlinear processing methods, which comprises following operations:

decomposing a nonlinear and unstable shear data signal s(t) into n intrinsic mode functions (IMFs) by empirical mode decomposition, with a decomposition formula as follows:

$$s(t) = \Sigma^n_{i=1} IMF_i(t) + r_n(t),$$

wherein $IMF_i(t)$ represents an $i^{th}$ intrinsic mode function, $i \in [1, n]$, and $r_n(t)$ is a residual component;

calculating wavelet coefficients $w_{a,b}$ corresponding to different intrinsic mode functions by using wavelet transform;

quantifying energy distribution characteristics corresponding to the respective intrinsic mode functions, and representing scale attributes corresponding to the different intrinsic mode functions with ratios of a length of the time series corresponding to the shear data signal s(t) to zero-crossing values corresponding to the wavelet coefficients $w_{a,b}$;

calculating a fluctuation of the energy local intermittency measure LIM based on the wavelet coefficients $w_{a,b}$ calculated in step 2.2, and identifying energy intermittent burst from the turbulent data according to LIM data, with a calculation formula as follows:

$$LIM = |w_{a,b}|^2 / <|w_{a,b}|^2>b,$$

wherein LIM represents the energy local intermittency measure;

a represents scale information of the wavelet coefficients, b represents a time scale corresponding to the wavelet coefficients; $w_{a,b}$ represents the wavelet coefficients, $|w_{a,b}|$ represents modulus value of the wavelet coefficients, and $<\cdot>b$ represents averaging process of the wavelet coefficients within time scale range b; and calculating phase change attributes during different intrinsic mode fluctuations, thereby completing topological definition of the nodes, wherein the nodes with different scale attributes are distributed in different network layer structures;

construction of the connecting edges is completed based on the physical properties contained in the nodes, which is as follows:

when two nodes with different scale attributes at a same time have energy local intermittency fluctuations being in a peak and beyond a mean value, and a fluctuation phase difference is less than a predetermined fluctuation phase difference threshold, there exists a connecting edge between the two nodes, that is, there exists the cross-scale transfer process of the turbulent energy between vortices of different scales represented by the two nodes; and when two nodes with different scale attributes at a same time have energy local intermittency measures that are not all in the peak or some of which are an energy local intermittency measure below the mean value, or a fluctuation phase difference is greater than a predetermined fluctuation phase difference threshold, there does not exist the connecting edge between the two nodes, that is, there does not exist cross-scale transfer process of the turbulent energy between the vortices of different scales represented by the two nodes; and a turbulent mixing intensity calculation module, configured to calculate the turbulent mixing intensity according to the topological attributes of the multi-layer turbulent mixing network, to obtain a turbulent mixing intensity value by calculation, which comprises:

analyzing the constructed multi-layer turbulent mixing network, and obtain the topological attributes of the multi-layer turbulent mixing network that comprise a number of nodes in each layer in the network structure, network layer scale attributes and a number of interlayer connecting edges, wherein the number of nodes in each layer in the network structure refers to a number of sampling points contained in the shear data signal s(t), and the network layer scale attributes refer to the ratios of the length of the time series corresponding to the shear data signal s(t) to zero-crossing values corresponding to the wavelet coefficients; and the number of interlayer connecting edges refers to the number of connecting edges constructed between two adjacent network layers upon meeting a connecting edge construction conditions; and calculating a turbulent mixing intensity κ depending on the topological attributes, with a formula as follows:

$$\kappa = \frac{1}{\sum_{\alpha\beta \subset L} \left(\frac{1}{2^{s_\alpha}} + \frac{1}{2^{s_\beta}}\right) \frac{e_{\alpha\beta}}{N}},$$

wherein N represents a total number of nodes contained in each network layer in the multi-layer turbulent mixing network;

α and β represent two adjacent network layers, $e_{\alpha\beta}$ represents a number of connecting edges between adjacent network layers α and β, and $S_\alpha$ and $S_\beta$ represent respective scale attributes of the two adjacent network layers α and β; and L represents a network layer set, and αβ∪L represents that α and β are network layers in the network layer set L.

4. A computer device, comprising a memory and a processor, wherein an executable code is stored in the memory, and when the processor executes the executable code, the steps of the method for calculating a turbulent mixing intensity according to claim 1 are implemented.

5. The computer device according to claim 4, wherein the preprocessing module is configured to perform denoising preprocess on ocean spatiotemporal coupled shear profile data information obtained by the turbulence profiler by:

performing the denoising preprocess on turbulent profile data by using a Goodman algorithm with reference to velocity data, gesture data and acceleration data of the turbulence profiler, collected during lowering of the turbulence profiler; and eliminating environmental noise and vibration noise contained in original shear data by the denoising preprocess, and retaining real shear data information.

6. A computer-readable storage medium in which a program is stored, wherein when the program is executed by a processor, the steps of the method for calculating a turbulent mixing intensity according to claim 1 are implemented.

7. The computer-readable storage medium according to claim 6, wherein the performing denoising preprocess on ocean spatiotemporal coupled shear profile data information obtained by the turbulence profiler comprises:

performing the denoising preprocess on turbulent profile data by using a Goodman algorithm with reference to velocity data, gesture data and acceleration data of the turbulence profiler, collected during lowering of the turbulence profiler; and eliminating environmental noise and vibration noise contained in original shear data by the denoising preprocess, and retaining real shear data information.

* * * * *